(12) United States Patent
Muff

(10) Patent No.: US 8,199,521 B2
(45) Date of Patent: Jun. 12, 2012

(54) MEMORY MODULE AND METHOD FOR OPERATING A MEMORY MODULE

(75) Inventor: Simon Muff, Mering (DE)

(73) Assignee: Qimonda AG, Munich (DE)

( * ) Notice: Subject to any disclaimer, the term of this patent is extended or adjusted under 35 U.S.C. 154(b) by 163 days.

(21) Appl. No.: 11/925,547

(22) Filed: Oct. 26, 2007

(65) Prior Publication Data

US 2008/0101105 A1   May 1, 2008

(30) Foreign Application Priority Data

Oct. 31, 2006   (DE) .......................... 10 2006 051 514

(51) Int. Cl.
*H05K 7/00* (2006.01)
(52) U.S. Cl. ........ 361/777; 361/736; 361/760; 361/784; 361/792; 361/793; 361/794; 365/52; 365/63; 257/685; 257/686; 714/42; 714/724; 714/735
(58) Field of Classification Search .................. 361/777, 361/736, 760.784, 792–794, 760, 784; 365/52, 365/63; 257/685, 686; 711/5, 105, 115; 714/42, 105, 724, 735
See application file for complete search history.

(56) References Cited

U.S. PATENT DOCUMENTS

| | | | | |
|---|---|---|---|---|
| 4,339,793 A * | 7/1982 | Marenin | ......................... | 712/32 |
| 4,394,753 A * | 7/1983 | Penzel | .......................... | 365/236 |
| 4,563,736 A * | 1/1986 | Boudreau et al. | ................ | 714/42 |
| 5,166,903 A * | 11/1992 | Aichelmann, Jr. | ........ | 365/189.03 |
| 5,272,664 A * | 12/1993 | Alexander et al. | .............. | 365/52 |
| 5,475,818 A * | 12/1995 | Molyneaux et al. | .......... | 709/208 |
| 5,513,135 A * | 4/1996 | Dell et al. | ......................... | 365/52 |
| 5,659,690 A * | 8/1997 | Stuber et al. | ................... | 710/307 |
| 5,748,806 A * | 5/1998 | Gates | ............................ | 710/315 |
| 5,790,447 A * | 8/1998 | Laudon et al. | .................. | 365/52 |
| 5,838,950 A * | 11/1998 | Young et al. | .................... | 703/21 |
| 5,987,623 A * | 11/1999 | Ushida | .............................. | 714/6 |
| 6,414,904 B2 * | 7/2002 | So et al. | ......................... | 365/239 |
| 6,449,213 B1 * | 9/2002 | Dodd et al. | ................. | 365/233.1 |
| 6,493,250 B2 * | 12/2002 | Halbert et al. | ................... | 365/63 |
| 6,639,820 B1 * | 10/2003 | Khandekar et al. | ............. | 365/63 |
| 6,646,936 B2 * | 11/2003 | Hamamatsu et al. | ......... | 365/201 |
| 6,683,372 B1 * | 1/2004 | Wong et al. | ..................... | 257/686 |
| 6,763,437 B1 * | 7/2004 | Nguyen et al. | ................ | 711/147 |
| 6,937,494 B2 * | 8/2005 | Funaba et al. | ................... | 365/63 |
| 6,947,304 B1 * | 9/2005 | Yen | .................................. | 365/63 |
| 7,010,642 B2 * | 3/2006 | Perego et al. | ..................... | 711/5 |
| 7,017,002 B2 * | 3/2006 | Perego et al. | ..................... | 711/5 |
| 7,020,815 B2 * | 3/2006 | Jeddeloh | ....................... | 714/718 |

(Continued)

FOREIGN PATENT DOCUMENTS

CN           1577627 A       2/2005

(Continued)

*Primary Examiner* — Xiaoliang Chen
(74) *Attorney, Agent, or Firm* — John S. Economou

(57) ABSTRACT

A memory module includes an electronic printed circuit board with at least one contact strip, a plurality of integrated memory components, at least one first and one second buffer component, and a number of conductor tracks, which proceed from the contact strip and which are arranged on or in the printed circuit board. The conductor tracks include data lines, control lines and address lines. The conductor tracks lead from the contact strip to the buffer components or to one of the buffer components. The printed circuit board has conductor tracks that are interposed between the first buffer component and the second buffer component and that lead from the first buffer component to the second buffer component.

14 Claims, 10 Drawing Sheets

U.S. PATENT DOCUMENTS

| | | | |
|---|---|---|---|
| 7,035,962 B1 * | 4/2006 | Ryan | 711/5 |
| 7,072,201 B2 | 7/2006 | So et al. | |
| 7,095,661 B2 * | 8/2006 | Osaka et al. | 365/194 |
| 7,162,663 B2 * | 1/2007 | Beer et al. | 714/29 |
| 7,165,153 B2 * | 1/2007 | Vogt | 711/154 |
| 7,181,584 B2 * | 2/2007 | LaBerge | 711/167 |
| 7,206,897 B2 * | 4/2007 | Perego et al. | 711/105 |
| 7,224,595 B2 | 5/2007 | Dreps et al. | |
| 7,274,582 B2 * | 9/2007 | Klein | 365/63 |
| 7,320,047 B2 * | 1/2008 | Perego et al. | 711/5 |
| 7,351,072 B2 * | 4/2008 | Muff et al. | 439/74 |
| 7,375,971 B2 * | 5/2008 | RaghuRam et al. | 361/736 |
| 7,379,316 B2 * | 5/2008 | Rajan | 365/63 |
| 7,379,361 B2 * | 5/2008 | Co et al. | 365/201 |
| 7,380,179 B2 * | 5/2008 | Gower et al. | 714/53 |
| 7,383,399 B2 * | 6/2008 | Vogt | 711/149 |
| 7,386,696 B2 | 6/2008 | Jakobs et al. | |
| 7,403,409 B2 | 7/2008 | Dreps et al. | |
| 7,426,149 B2 * | 9/2008 | Kim et al. | 365/201 |
| 7,447,954 B2 * | 11/2008 | Shin et al. | 714/718 |
| 7,487,428 B2 * | 2/2009 | Co et al. | 714/763 |
| 7,529,112 B2 | 5/2009 | Dreps et al. | |
| 7,542,322 B2 * | 6/2009 | McCall et al. | 365/52 |
| 7,551,468 B2 | 6/2009 | Dreps et al. | |
| 7,586,955 B2 * | 9/2009 | Iizuka | 370/516 |
| 7,609,567 B2 * | 10/2009 | Rajan et al. | 365/189.2 |
| 2003/0043613 A1 * | 3/2003 | Doblar et al. | 365/63 |
| 2004/0100812 A1 * | 5/2004 | Wu | 365/72 |
| 2004/0105292 A1 * | 6/2004 | Matsui | 365/63 |
| 2004/0133736 A1 * | 7/2004 | Kyung | 711/105 |
| 2004/0246786 A1 * | 12/2004 | Vogt | 365/199 |
| 2005/0018495 A1 * | 1/2005 | Bhakta et al. | 365/199 |
| 2005/0044305 A1 | 2/2005 | Jakobs et al. | |
| 2005/0091630 A1 * | 4/2005 | Madurawe | 716/16 |
| 2005/0177695 A1 * | 8/2005 | Larson et al. | 711/167 |
| 2005/0268193 A1 * | 12/2005 | Waayers | 714/727 |
| 2006/0006419 A1 * | 1/2006 | Shin et al. | 257/200 |
| 2006/0023482 A1 | 2/2006 | Dreps et al. | |
| 2006/0050497 A1 | 3/2006 | Goodwin | |
| 2006/0209613 A1 * | 9/2006 | Johnson et al. | 365/230.01 |
| 2006/0282599 A1 * | 12/2006 | Chiu | 710/306 |
| 2007/0038831 A1 * | 2/2007 | Kim et al. | 711/167 |
| 2007/0079057 A1 * | 4/2007 | Ruckerbauer et al. | 711/105 |
| 2007/0088995 A1 * | 4/2007 | Tsern et al. | 714/724 |
| 2007/0195505 A1 * | 8/2007 | Savignac et al. | 361/719 |
| 2007/0195572 A1 | 8/2007 | Dreps et al. | |
| 2007/0288679 A1 | 12/2007 | Dreps et al. | |
| 2008/0094811 A1 * | 4/2008 | Hazelzet | 361/760 |
| 2008/0098277 A1 * | 4/2008 | Hazelzet | 714/753 |
| 2008/0177942 A1 | 7/2008 | Dreps et al. | |
| 2008/0183957 A1 | 7/2008 | Dreps et al. | |

FOREIGN PATENT DOCUMENTS

| | | |
|---|---|---|
| CN | 1728073 A | 2/2006 |
| DE | 10 2004 039 806 A1 | 3/2005 |
| DE | 103 30 812 A1 | 4/2005 |
| JP | 2005-063448 A | 3/2005 |
| KR | 10-2005-0017353 | 2/2005 |

* cited by examiner

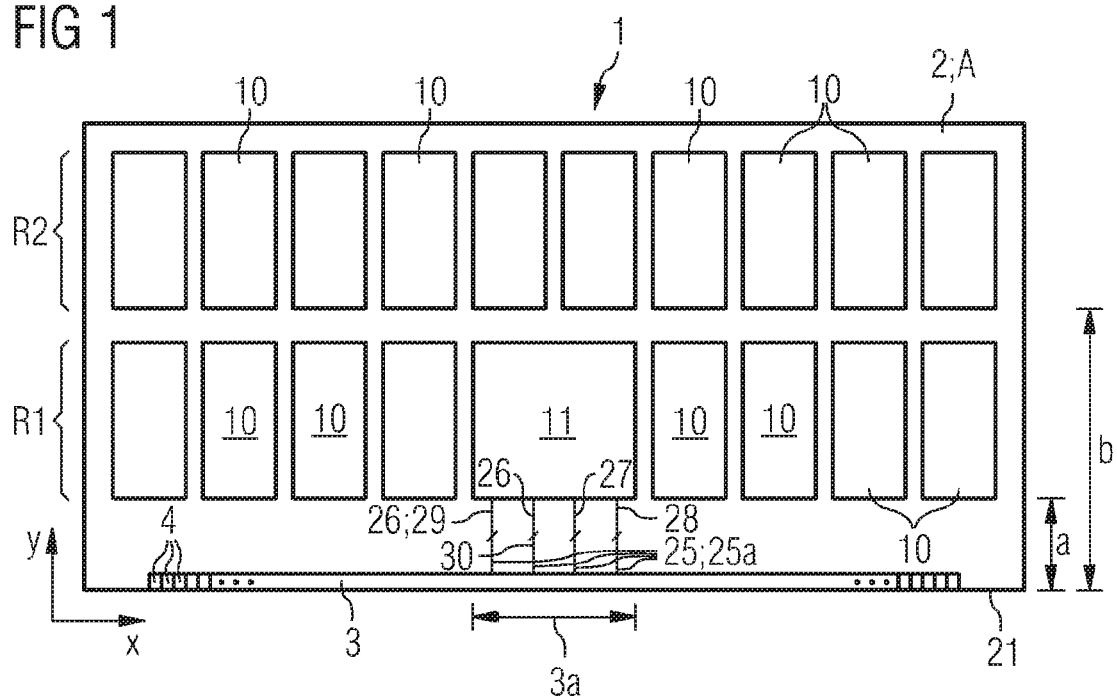
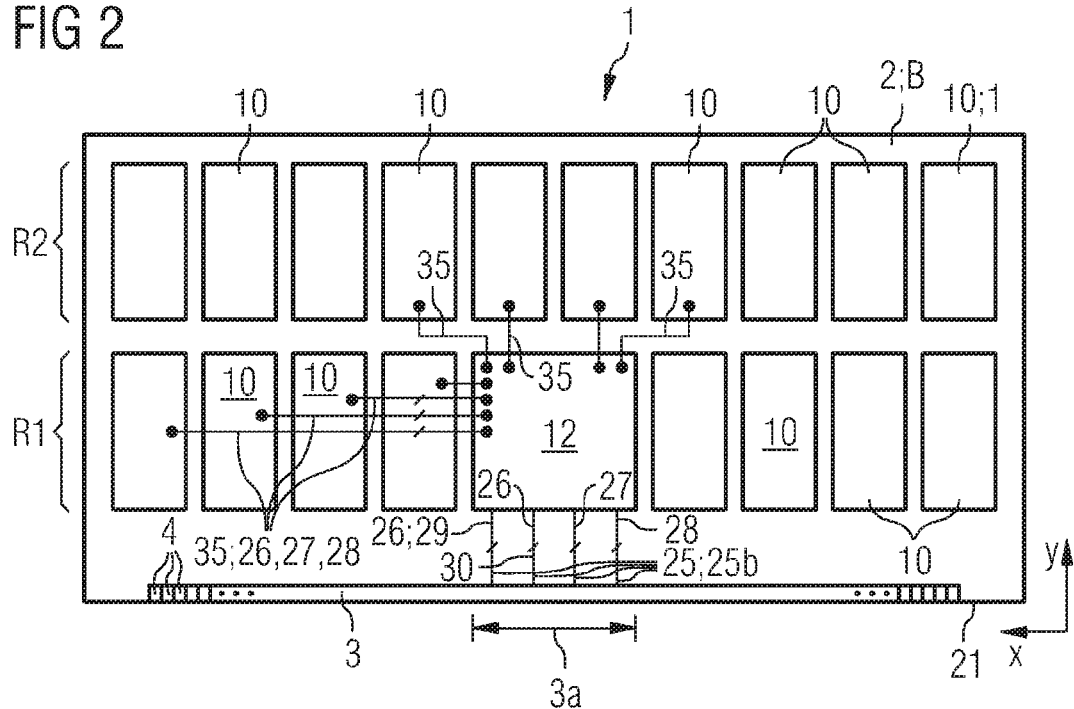

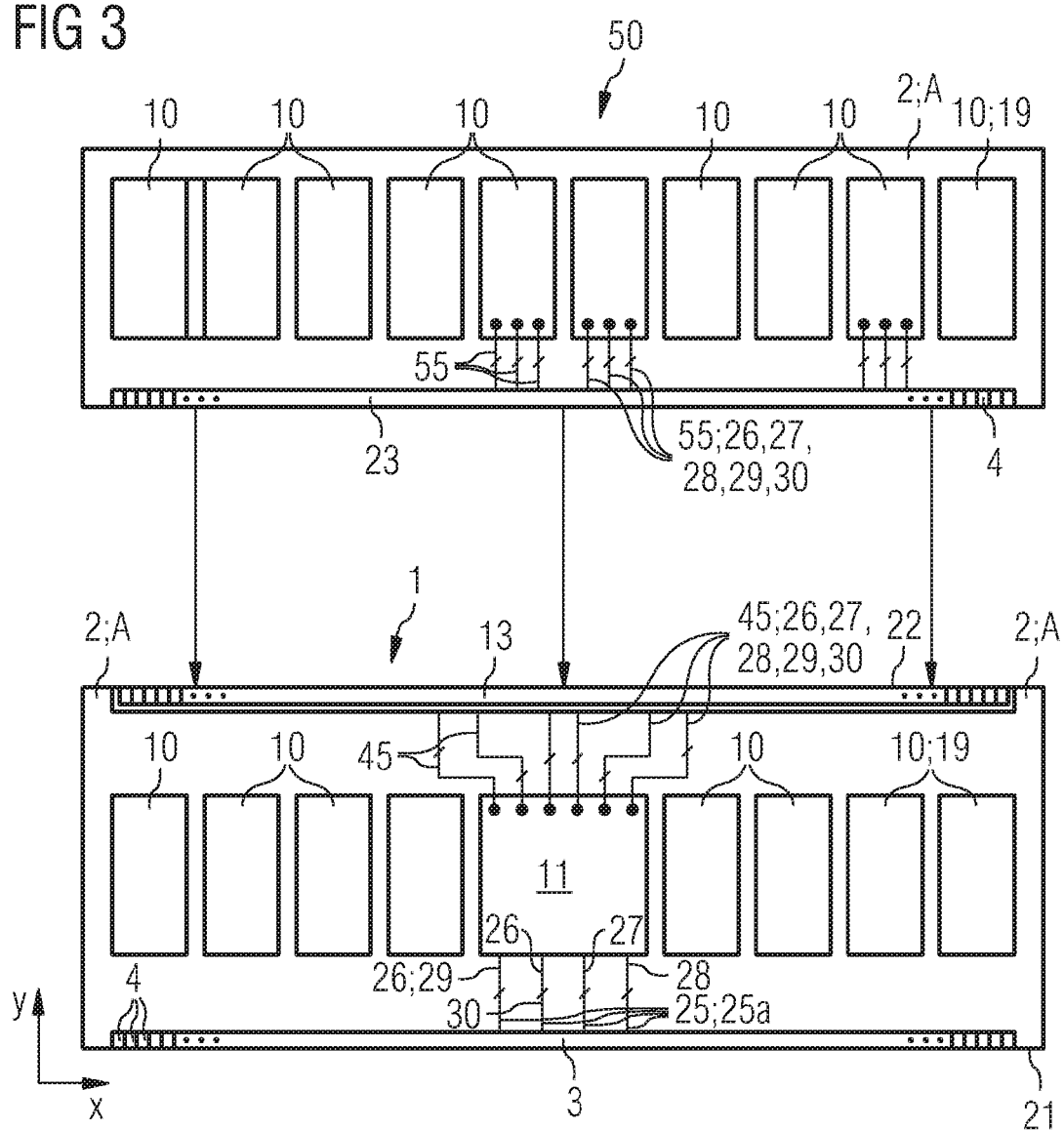

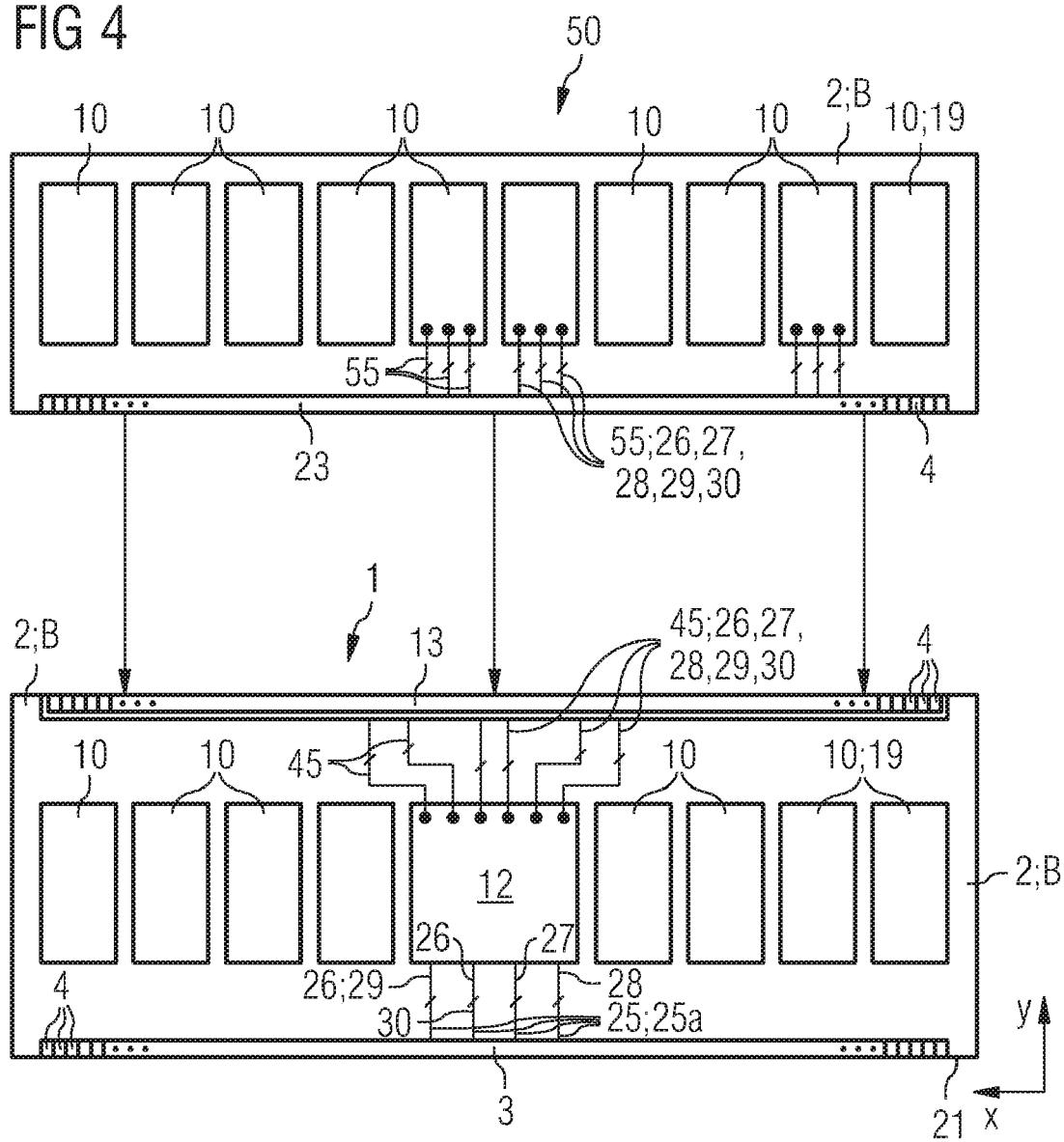

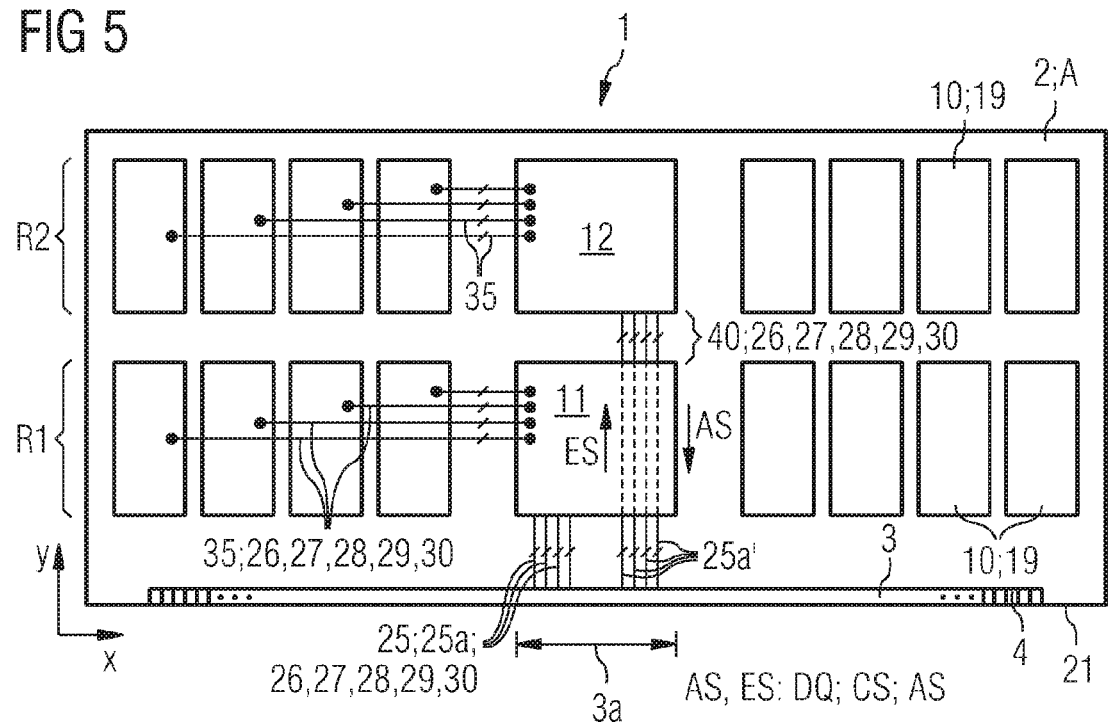
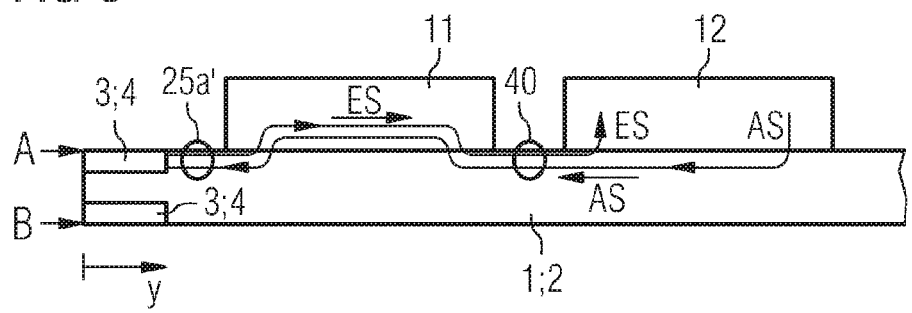

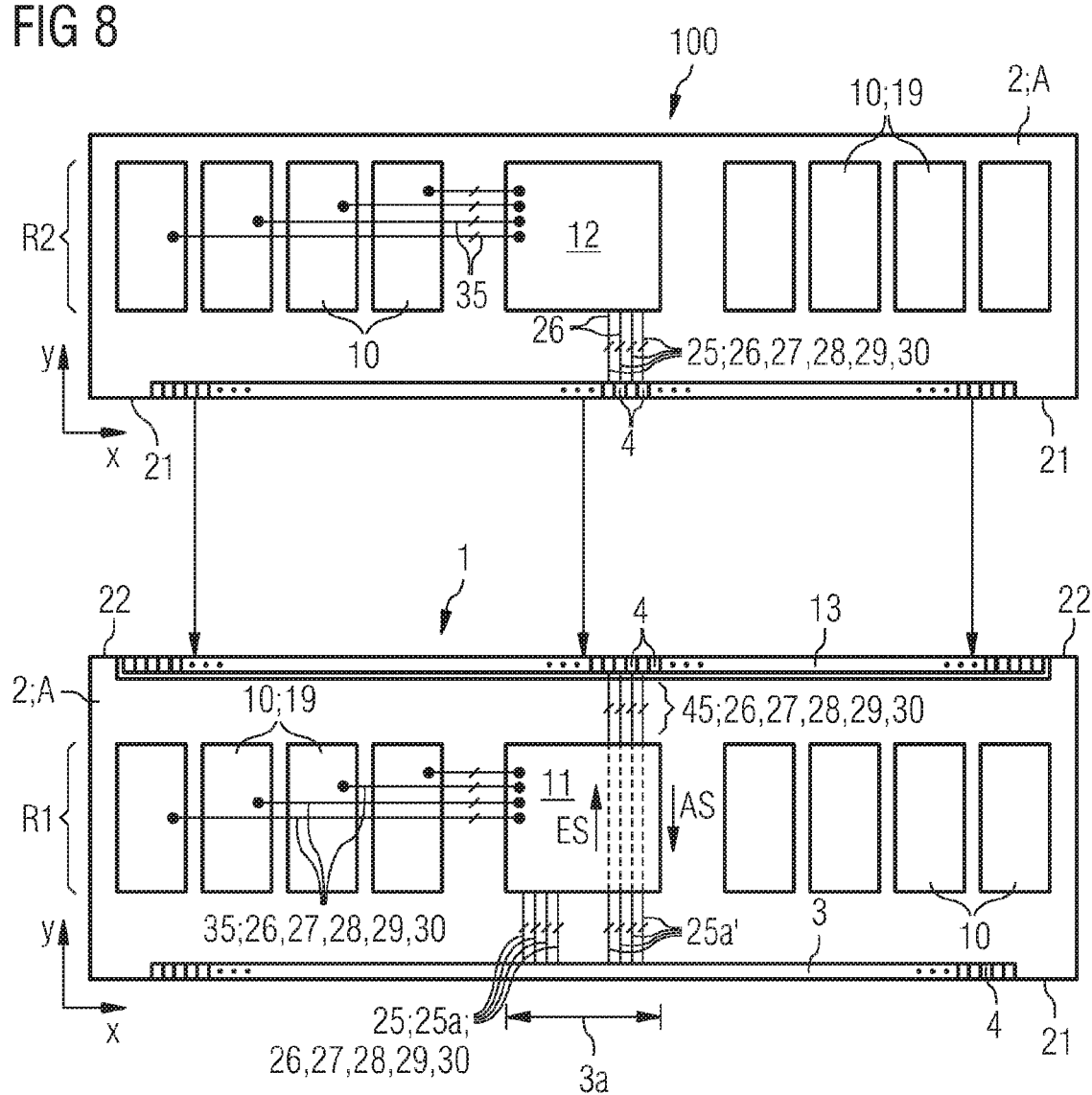

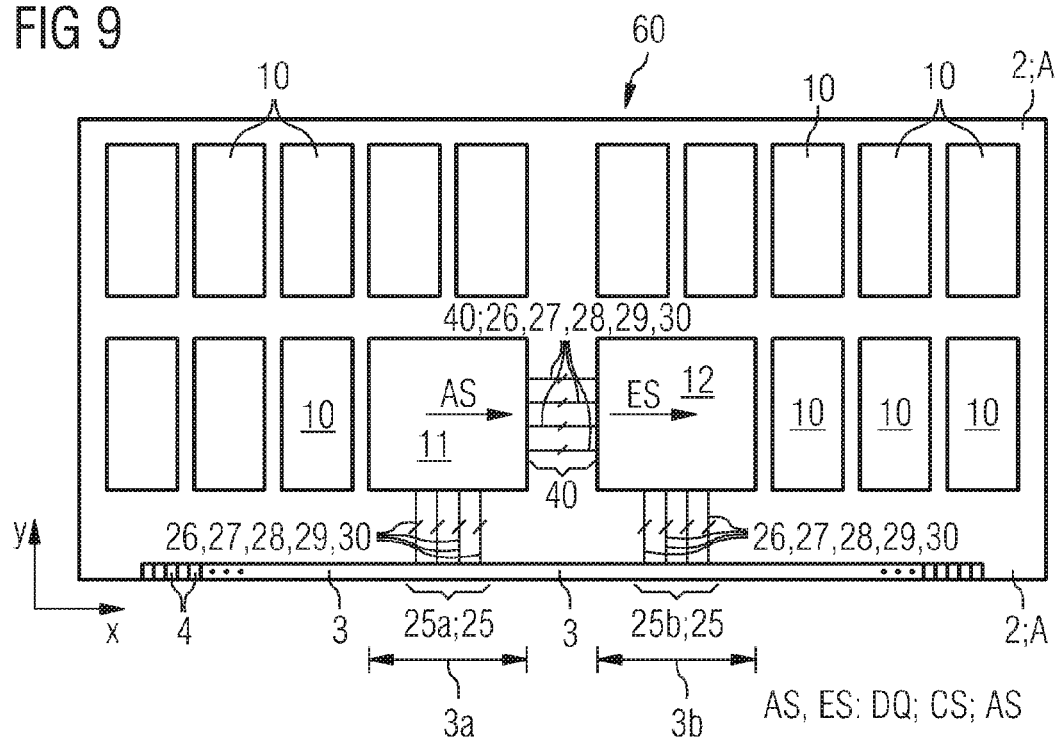
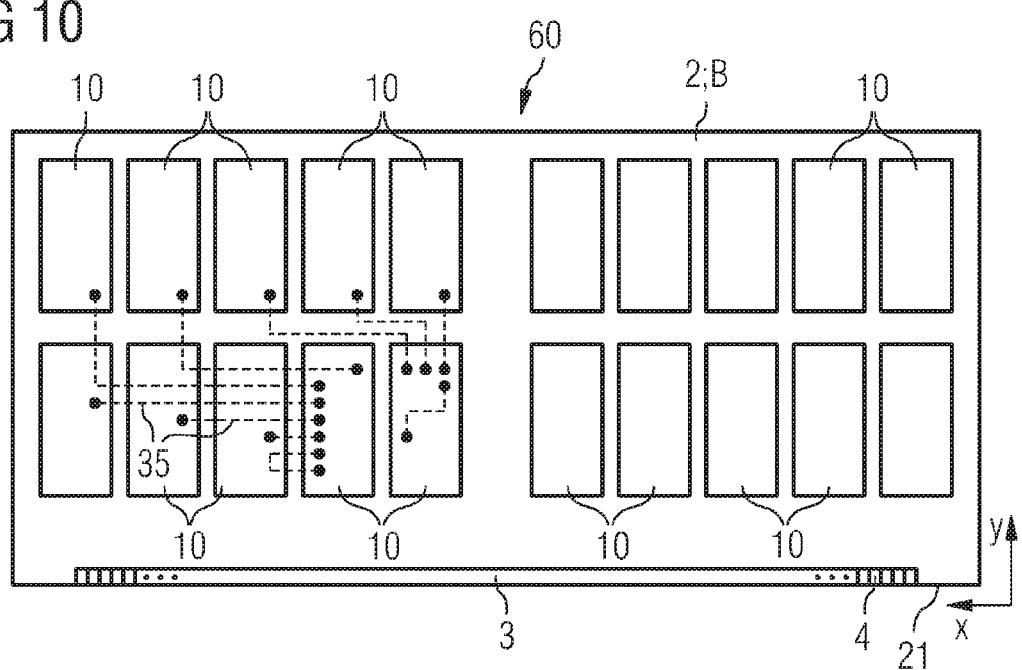

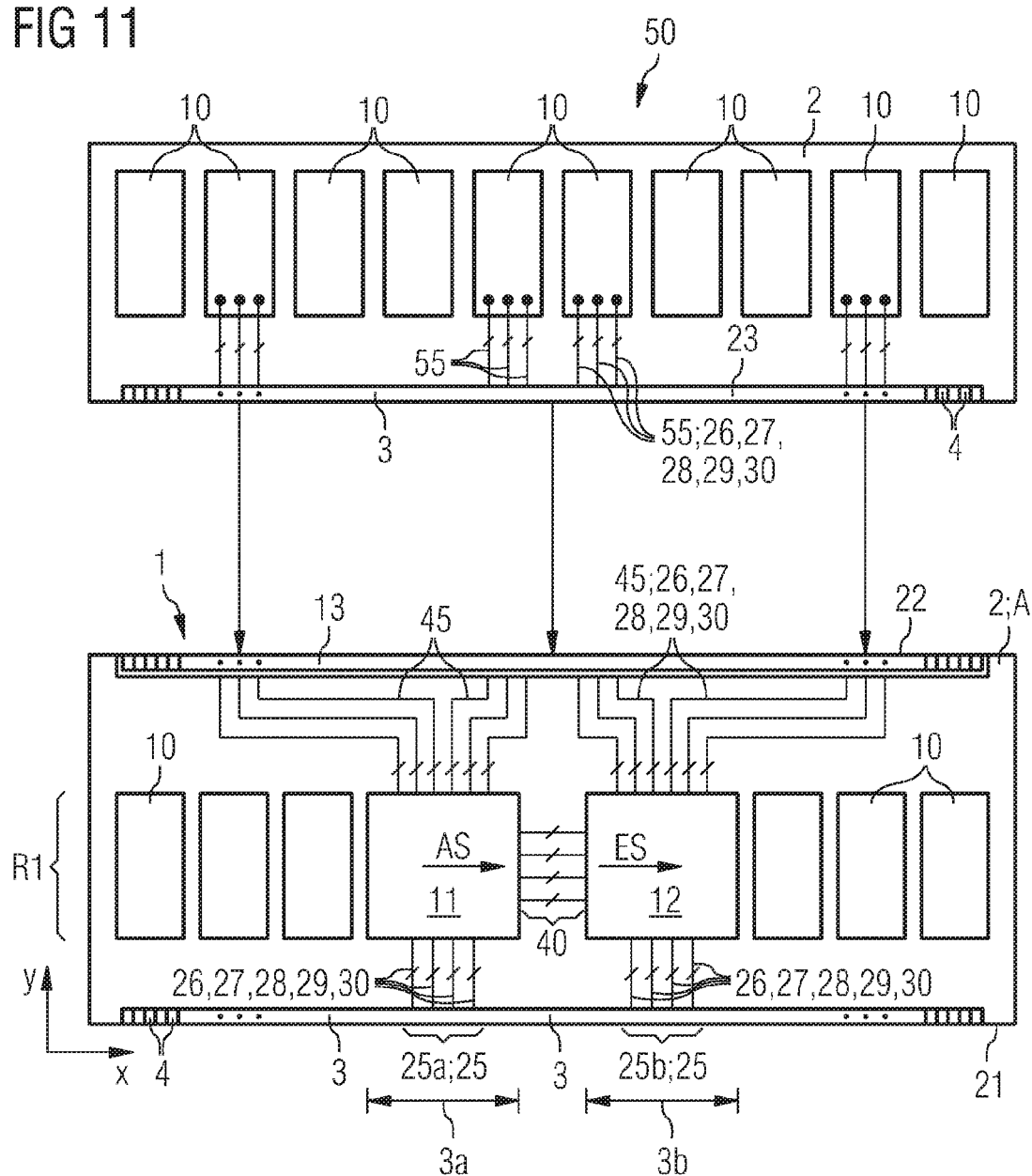

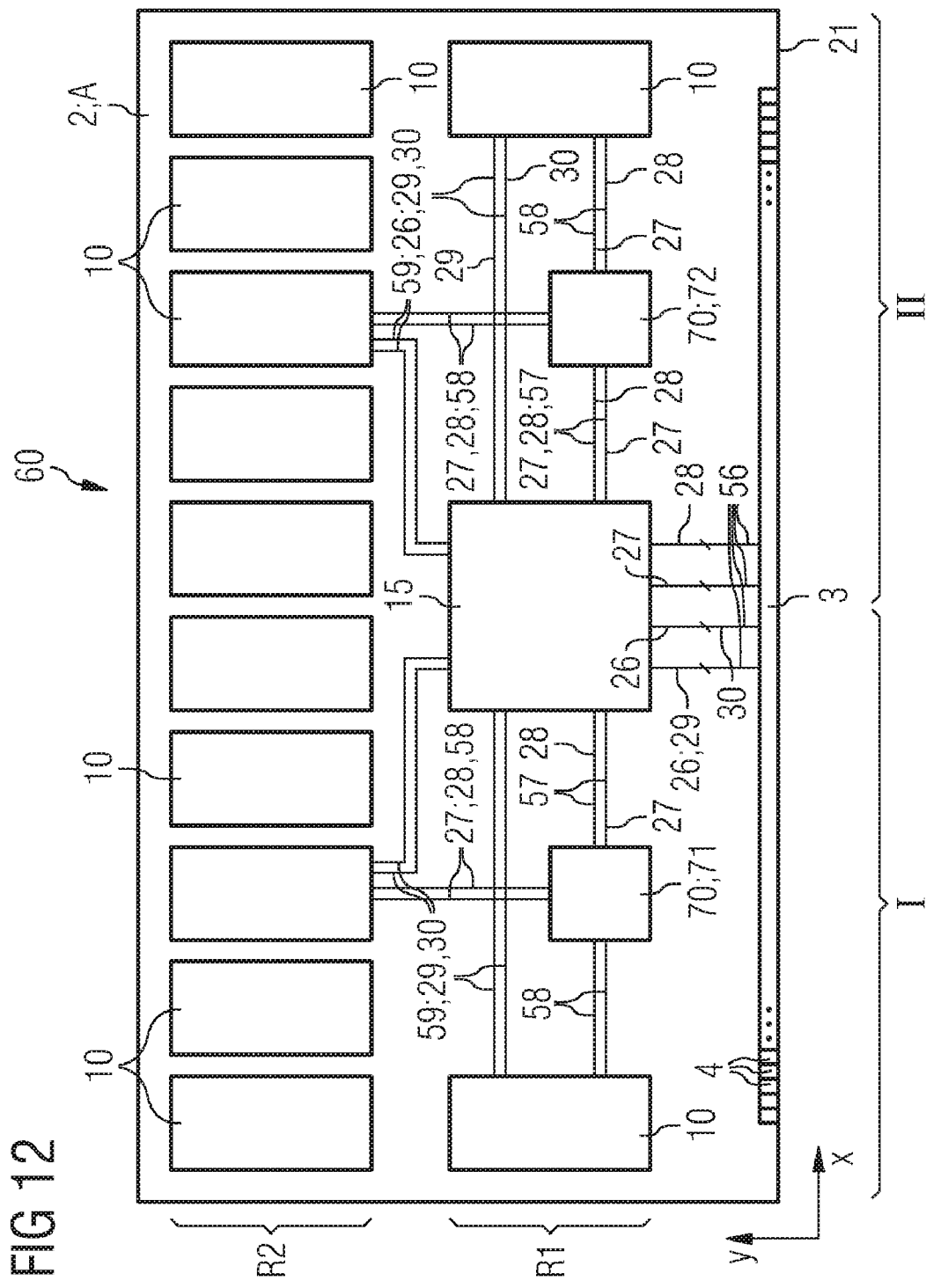

MEMORY MODULE AND METHOD FOR OPERATING A MEMORY MODULE

This application claims priority to German Patent Application 10 200 514.5, which was filed Oct. 31, 2006, and is incorporated herein by reference.

TECHNICAL FIELD

Embodiments of the invention relate to the field of memory modules and the integration and driving of semiconductor components of memory modules.

BACKGROUND

Motherboards or other superordinate electronic units have slots into which a respective memory module can be inserted by its contact strip. The contact strip has a plurality of contact terminals arranged on one or preferably on both main surfaces of a printed circuit board of the memory module. In particular memory modules equipped with memory components on two sides and provided with the contact strip on two sides (DIMM; Dual Inline Memory Module) make it possible to operate a particularly high number of memory components, for example, housed semiconductor components such as DRAMs (Dynamic Random Access Memory), for instance. The DRAMs or other volatile (and also non-volatile) semiconductor components can be arranged, for example, in the form of housed memory components on the main surfaces of the printed circuit board of the memory module. The chip housings of the memory components can be BGAs (Ball Grid Arrays), for example, which each have a plurality of external contact terminals (typically hundreds of them).

One possible design of memory modules provides for the data values intended for the memory components, that is to say both the data values to be stored in the memory components and the data values that are read out or to be read out from the semiconductor components, to be communicated via conductor tracks which connect the relevant memory component to the contact strip (that is to say to the respective contact terminal of the contact strip). In this case, the memory components are connected directly to the contact strip in parallel with one another. The control signals and address signals, in contrast, are not conducted directly from the contact strip to the respective memory component, but rather are communicated via an interposed further component, a register component. In these so-called "registered DIMM", the line paths for the control and address signals thus run via conductor tracks connected to the contact strip, via a register component and then via conductor tracks connected downstream of the register component to the respective semiconductor component. The control and address signals are also combined as "CA Bus" or "CA Data" (Control Address). These data are buffered via the register component, thereby avoiding interference that otherwise arises at least at high transmission frequencies on account of the high capacitance value resulting from the large number of parallel-connected semiconductor components or conductor tracks to be biased in parallel with one another.

In another design, the so-called fully buffered DIMM (FBD), the data values which are to be stored and are to be read out or are read out could also be buffered, to be precise via a buffer component serving for buffering and subsequently forwarding both the data values, the control signals and the address signals. Such an advanced memory buffer (AMB) therefore also distributes the data values to be written between the respective memory components. Consequently, in each case the memory components are no longer connected directly to the contact strip by its own data lines. Instead, both the data lines and the control and address lines lead from the contact strip (through the printed circuit board) firstly to the buffer component. The memory components are connected to the buffer component in each case by dedicated control lines, address lines and data lines, to be precise preferably in parallel with one another.

In this case, the number of memory components which can be integrated and can be driven practically on a memory module is limited. A buffer component can drive, for example, only memory components of two memory banks ("ranks"). If nine semiconductor components are driven per rank, for example, then a maximum of eighteen memory components can be connected to the buffer component, to be operated on the respective memory module. In order to operate a higher number of semiconductor memory components, further slots of the motherboard or of the superordinate electronic unit are usually utilized, into which additional memory modules are inserted. By way of example, four memory modules can be inserted into four slots of a motherboard, in each case eighteen memory components (corresponding to two memory banks) being operated on each memory module. In the event of the driving of the buffer components of the memory modules, use is made, for example, of data frames created in accordance with defined data protocols. Data packets, the respective buffer component and thus the respective memory module identify, on the basis of the data frames, which data are intended in each case for the relevant memory module and which are not.

Nevertheless, there is conventionally the restriction to a predetermined maximum number of memory components which can be operated per slot.

SUMMARY OF THE INVENTION

In one embodiment, the present invention provides a memory module. The memory module includes electronic printed circuit board with at least one contact strip, a plurality of integrated memory components, at least one first and one second buffer component, and a number of conductor tracks, which proceed from the contact strip and which are arranged on or in the printed circuit board. The conductor tracks include data lines, control lines and address lines. The conductor tracks lead from the contact strip to the buffer components or to one of the buffer components. The printed circuit board has conductor tracks that are interposed between the first buffer component and the second buffer component and that lead from the first buffer component to the second buffer component.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 and 2 show a first embodiment of a memory module;

FIGS. 3 and 4 show two further embodiments of memory modules;

FIGS. 5 and 7 show yet another embodiment of a memory module;

FIG. 6 shows a cross-sectional view of the memory module from FIGS. 5 and 7;

FIG. 8 shows two further embodiments of memory modules;

FIGS. 9 and 10 show a further embodiment of a memory module;

FIG. 11 shows a further embodiment of a memory module;

FIG. 12 shows yet another embodiment of a memory module;

DETAILED DESCRIPTION OF ILLUSTRATIVE EMBODIMENTS

Figure 7:
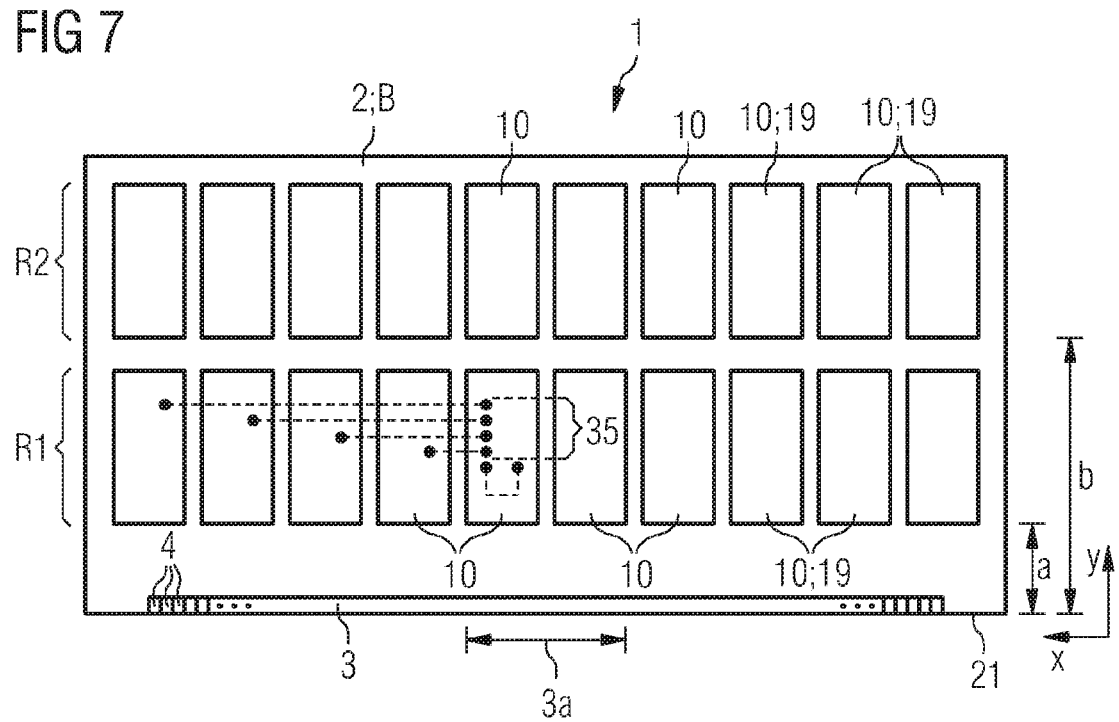

FIG. 1 shows an embodiment of a memory module 1, wherein the plan view of a first main surface A of a printed circuit board 2 of the memory module 1 is illustrated.

In FIG. 1, the printed circuit board 2 has a contact strip 3 having a plurality of contact terminals 4. The contact strip 3 is, for example, not just arranged on the first main surface A, but also comprises further contact terminals on the second main surface B (FIG. 2). A plurality of memory components 10, which can be, for example, volatile memory components such as DRAMs, for instance, are arranged on the first main surface A in accordance with FIG. 1. They are in particular housed semiconductor components having a ball grid array (BGA) for example.

Two buffer components are provided on the printed circuit board 2 of the memory module 1. Namely a first buffer component 11, which is arranged on the first main surface A of the printed circuit board 2, and a second buffer component 12, which (in accordance with the exemplary embodiment of FIGS. 1 and 2) is arranged on the second main surface B (FIG. 2). Whereas the protocol-based driving, which is provided for future memory modules and is carried out with data frames, of a plurality of memory modules at different slots has hitherto assumed that precisely one memory module is connected per slot and therefore also only precisely one buffer component is provided per memory module or per slot, the memory module is equipped with two such buffer components and therefore makes it possible to drive a larger number of memory components which cannot be operated simultaneously on a memory module according to previous considerations. With the aid of the memory module, which can comprise two (or else more) buffer components, twice the number or an even larger number of memory components can be provided and operated on the printed circuit board. Thus, the size of the printed circuit board can consequently be increased in order to accommodate a higher number of semiconductor chips. A correspondingly larger number of memory components can simultaneously be driven in parallel with one another. On the memory module, the memory components connected to two buffer components are driven and operated as if they were arranged on separate memory modules. In this case, each buffer component 11, 12 recognizes on the basis of the respective data frames whether or not the respectively received data are intended for the buffer component. The remaining data are forwarded by the buffer component, to be precise independently of whether they are intended for the second buffer component determined on the same memory module or for a buffer component of an arbitrary other memory module inserted at another slot.

The buffer components 11, 12 arranged on the front side and on the rear side in FIGS. 1 and 2 are in each case connected to a plurality of conductor tracks 25. The respective conductor tracks 25 in each case comprise data lines 26, control lines 27 and address lines 28. The data lines 26 can comprise in particular first data lines 29 (for data values to be communicated to the respective buffer component 11, 12) but also second data lines 30 (for data values which are to be read out or are read out and are forwarded from the buffer components to the contact strip 3). All of these various conductor tracks 25, 26, 27, 28, 29, 30 are usually provided in relatively large numbers. FIGS. 1 and 2 merely indicate an indeterminate plurality of the corresponding conductor tracks. With the aid of first conductor tracks 25*a* which, for example, run on the first main surface A or at least lead to it, the first buffer component 11 is connected to the contact strip 3. With the aid of second conductor tracks 25*b* (FIG. 2) the second buffer component 12 is connected to the contact strip 3 on the rear side of the memory module. In accordance with the exemplary embodiment of FIGS. 1 and 2, both buffer components 11, 12 are situated along in each case the same section 3*a* of the contact strip 3. This enables both buffer components 11, 12 to be driven practically in terms of wiring technology from the contact strip. A development of this and other embodiments in which, through buffer-component-internal redistribution wiring, some of the contact terminals 4 of the contact strip can be utilized jointly by both buffer components 11, 12 will also be explained at a later point with reference to FIG. 14.

A corresponding number of (for example, eighteen) memory components 10 are in each case connected to each of the buffer components 11, 12. In this case, the memory components 10 are each individually connected via further conductor tracks 35 to the respective buffer component. FIG. 2 illustrates some of the further conductor tracks 35 in a manner representative of the rest. In particular, each semiconductor component 10 is connected to the respective buffer component 11 or 12 via dedicated further conductor tracks 35, which in each case comprise data lines 26 (once again both first data lines 29 and second data lines 30), control lines 27 and address lines 28, for example, in parallel with one another.

By way of example, the memory components 10 are arranged on each main surface A, B at two different distances from the contact strip 3 or from a first edge 21 along which the contact strip 3 extends. Thus, FIG. 1 illustrates a first row R1 of memory components 10 arranged at a first, smaller distance a from the first edge 21. Furthermore, a second row R2 of further semiconductor components 10 arranged at a second, larger distance b from the first edge 21 is provided. In FIG. 1, eighteen memory components, corresponding to two ranks or memory banks, can be provided on the same main surface A; the same applies to the rear-side main surface B (FIG. 2). By way of example, on both main surfaces A, B of the printed circuit board 2, the respective buffer component 11, 12 is in each case arranged within the first row R1 of memory components 10. This facilitates the wiring or interconnection of the buffer components 11, 12 with the contact terminals 4 of the contact strip 3. Moreover, on the basis of the first x and second direction y marked by arrows it is indicated that the rear view illustrated in FIG. 2 is illustrated in mirror-inverted fashion with respect to the y axis relative to FIG. 1. This mode of illustration is also chosen in part in some of the subsequent figures.

FIG. 3 shows further embodiments of memory modules, with which it is possible to drive a larger number of memory components per module slot. FIG. 3 shows a further embodiment of a memory module 1 and also an exemplary embodiment of a further memory module 50, which can be operated with the aid of the first-mentioned memory module 1. The memory module 1 (illustrated at the bottom in FIG. 3) has not only the contact strip 3 but also a further contact strip 13, into which a contact strip 23 of the further memory module 50 can be inserted. For this propose, the further contact strip 13 of the memory module 1 is configured in a suitable manner; by way of example, the further contact strip 13 can be formed in such a way that it reaches around or encloses the contact strip 23 of the further memory module 50. The contact strip 23 can equally reach around the further contact strip 13 of the first memory module 1. Consequently, the further memory module 50 illustrated at the top in FIG. 3 can be inserted into the memory module 1 and can be operated from the latter.

FIG. 4 shows in each case the rear side of the memory modules illustrated in FIG. 3. The memory modules 1, 50 are formed on the respective second main surface B analogously to the first main surface A; the views are in each case mirrored with respect to one another, as can be discerned on the basis of the first direction x and second direction y illustrated in FIGS. 3 and 4. The memory module 1 has a dedicated buffer component 11, 12 in each case on both main surfaces A, B, the buffer component being connected to the contact strip 3 by conductor tracks 25 as in FIGS. 1 and 2. The further contact strip 13 is additionally provided, however, for example, on both main surfaces A, B of the memory module 1. Furthermore, connecting lines 45 are additionally provided, which lead to the further contact strip 13 proceeding from the respective buffer component 11, 12. FIGS. 3 and 4 merely illustrate some of the connecting lines 45 in a manner representative of the rest. The number of connecting lines depends on how many memory components 10 are to be provided, for example, on the further memory module 50 per main surface or per buffer component 11 or 12 of the memory module 1. The connecting lines 45 serve for operating the memory components 10 of the further memory module 50 via the respective buffer component 11, 12 of the memory module 1. Therefore, the connecting lines 45 comprise, for each memory component 10 of the further memory module 50, in each case dedicated data lines 26 (including first and second data lines 29, 30 for incoming and outgoing data signals), control lines 27 and address lines 28.

Therefore, no dedicated buffer component is provided on the further memory module 50. Instead, the semiconductor components or the memory components 10 are directly connected to the contact strip 23 of the further memory module 50 via corresponding conductor tracks 55. The conductor tracks 55 have in the same way as the connecting lines 45 on the memory module 1 in each case data lines 26 (including first and second data lines 29, 30), control lines 27 and address lines 28. The further memory module 50 would not be operable independently, that is to say without interposition of another memory module having at least one buffer component. The memory components 10 of the further memory module 50 are also not connected up via register components that would be connected between the memory components 10 and the contact strip 23. Instead, the memory components 10 of the further memory module 50 receive all data, control and address signals indirectly from the respective buffer component 11 or 12 of the memory module 1.

It is noted at this point that throughout the application the conductor tracks respectively mentioned, in particular data lines 26, control lines 27 and address lines 28 and also the rest of the conductor tracks can be formed as line pairs in which a temporally altered reference potential between the two mutually complementary individual lines of the line pair in each case indicates the respective communicated data bit. Likewise, dedicated clock signal lines which enable a temporally coordinated transmission of the respective signals can in each case be added to all the conductor tracks, for example, the data lines 26 (both the first and the second data lines 29, 30), the control lines 27 and the address lines 28.

By way of example, precisely a single further memory module 50 can be connected to the memory module 1 of FIGS. 3 and 4. As an alternative, a plurality of memory modules connected downstream can also be connected, for example, a further memory module 1 in accordance with FIGS. 3 and 4 and then a memory module 50 to the further memory module. Consequently, the memory module of FIGS. 3 and 4 enables a plurality of memory modules of identical type or different memory modules to be connected one downstream of another and thus to be operated on the same slot of a superordinate electronic unit, for example, a motherboard.

FIGS. 5 and 7 show a further embodiment of a memory module. FIG. 5 illustrates the plan view of a first main surface A of this memory module 1. FIG. 7 shows the plan view of the second main surface B of the same memory module 1. In accordance with FIG. 5, a first buffer component 11 and a second buffer component 12 are arranged on the same main surface A of the printed circuit board 2, to be precise once again along the same or substantially the same section 3a of the contact strip 3. However, the two buffer components 11, 12 are arranged at two different distances from the contact strip in the direction y perpendicular to the contact strip. They can be incorporated, for example, into a first row R1 and a second row R2 of semiconductor components 10. In the embodiment illustrated in FIG. 5, one special feature consists of the fact that the second buffer component 12 is connected downstream of the first buffer component 11 insofar as the signals (for example, both the input signals and the output signals) intended for the second buffer component 12 are conducted via the first buffer component 11. It goes without saying that the signals intended for the second buffer component 12 can also be communicated via leads which do not lead via the first buffer component 11. The interconnection illustrated in FIG. 5 facilitates the wiring layout, however, particularly when, in the case where a protocol-based scheme of data frames is used, the data frames for a plurality of buffer components are conducted to each of the buffer components and the respective buffer component selects and processes the data frames intended for it, and in contrast forwards the rest of the data frames to the rest of the buffer components.

In accordance with FIG. 5, conductor tracks 40 interposed between the two buffer components 11, 12 are provided, which conductor tracks lead from the first buffer component 11 to the second buffer component 12 and comprise, for example, data lines 26 (including first data lines 29 and second data lines 30 for data values to be stored and also data values that are to be read out or are read out), control lines 27 and address lines 28. The suitable number of the respective conductor tracks is chosen in a suitable manner and is merely indicated in FIG. 5. Conductor tracks 25 are provided toward the contact strip 3, to be precise conductor tracks 25a and 25a', which connect the first buffer component 12 to the contact strip 3. Of these the conductor tracks 25a are intended for driving the first buffer component 11, whereas further conductor tracks 25' lead to the first buffer component 11 yet are intended for operating the second buffer component 12. For this purpose, the respective line paths are continued through the first buffer component 11, as indicated by the dashed lines in the region of the first buffer component 11 in FIG. 5. From there the line paths lead further via the interposed conductor tracks 40 through to the second buffer component 12.

A plurality of memory components 10, for example, of semiconductor components with a volatile random access memory 19, are connected to each of the two buffer components 11, 12. For this purpose, further conductor tracks 35 are provided in each case, by means of which further conductor tracks the memory components 10 are connected to the respective buffer component in each case in parallel with one another. The further conductor tracks 35 are illustrated only for some of the memory components 10 for the sake of clarity in FIGS. 5 and 7. No buffer component is provided on the second main surface B of the printed circuit board 2 (FIG. 7). Instead, in that region of the main surface in which the buffer components are situated on the opposite front side, the available area is occupied by further memory components 10. In this way, by way of example, a number of memory components corresponding to two memory banks or ranks can be connected to each buffer component. For this purpose, plated-through holes (not illustrated) are provided within the printed circuit board 2, with the aid of which plated-through holes the memory components provided on the second main surface B are connected up to the buffer components mounted on the front side. FIGS. 5 and 7 illustrate the further conductor tracks 35, serving for connecting up the memory components to the buffer components, only for some of the memory components 10 for the sake of clarity. Moreover, FIGS. 5 and 7 show an embodiment in which the memory components 10 of a first row R1 of memory components are connected to the first buffer component 11, whereas those memory components 10 of the second row R2 are connected to the second buffer component 12.

FIG. 6 shows a cross-sectional view through the center of the memory module illustrated in FIGS. 5 and 7 along the direction y at the level of the two buffer components 11 and 12. FIG. 6 therefore schematically shows the line paths via which the second buffer component 12 is driven from the contact strip 3. As can be discerned in FIG. 6, the line paths lead via the conductor tracks 25a' to the first buffer component 11 and through the buffer component 11. From there the light paths run further through the interposed conductor tracks 40 to the second buffer component 12. In this way, both the input signals ES and the output signals AS of the second buffer component 12 can be conducted through the first buffer component (or optionally also only some of the communicated signals). The number of contact terminals 4 which are required in the contact strip 3 for operating the two buffer components and their memory components connected downstream can thereby be reduced.

FIG. 8 shows a further embodiment of memory modules that are modified in comparison with the exemplary embodiment of FIGS. 5 and 7 insofar as two memory modules 1, 100 that are to be connected one-between another are once again proposed, in the case of which a first memory module 1 can be inserted by its first contact strip 3 directly onto the slot 1 of the superordinate electronic unit and the memory module 100 connected downstream can be inserted (as necessary or permanently) into a further contact strip 13 of the first memory module 1 itself. In this way, the buffer component 12 arranged on the memory module 100 connected downstream, together with the memory components 10 connected downstream of the buffer component, can be operated via line paths which lead via the memory module 1 and in particular via the first and sole buffer component 11 thereof.

Connecting lines 45 leading to the further contact strip 13 of the printed circuit board 2 of the memory module 1 are provided at the memory module 1. With the aid of the connecting lines 45, which can comprise, for example, once again data lines 26; 29, 30, control lines 27 and address lines 28 (and once again in each case dedicated clock signal lines), one or a plurality of memory modules connected downstream can be operated from the same slot. On both memory modules 1, 100 in FIG. 8, the respective memory components are connected to the respective buffer component 11, 12 via further conductor tracks 35 once again comprising data lines, control lines and address lines. The further contact strip 13 can be connected to the contact strip 23 as described with reference to FIGS. 3 and 4.

The second main surfaces of the memory modules 1 and 100 illustrated in FIG. 8 are not illustrated pictorially. However, no further buffer component is provided on the second main surface of the respective memory module 1, 100. Instead, in each case a further number of memory components 10 are provided on the second main surface of both memory modules 1, 100, wherein the memory components 10 arranged together on both main surfaces A, B can in each case be driven via the buffer component 11 or 12 of the respective memory module 1 or 100. In the case of the memory module 100 connected downstream in FIG. 8, however, the memory components 10 are not connected up to the contact strip 23, but rather to the buffer component 12, which is itself connected up to the contact strip 23 via the conductor tracks 25. In particular, the data signals are communicated exclusively via the buffer component 12 between the memory components and the contact strip 23, as in the rest of the memory modules as well.

FIGS. 9 and 10 show a further embodiment of a memory module 60. FIG. 9 illustrates the plan view of the first main surface A of the printed circuit board 2 of the memory module 60. In accordance with FIG. 9, both buffer components 11, 12 are arranged alongside one another on the same main surface A, to be precise along two different sections 3a, 3b of the contact strip 3. Accordingly, conductor tracks 25 are provided, which connect the buffer components 11, 12 to the contact strip 3, wherein first conductor tracks 25a run between the contact strip and the first buffer component 11 and second conductor tracks 25b run between the contact strip 3 and the second buffer component 12. Conductor tracks 40 interposed between the two buffer components 11, 12 are additionally provided, which can comprise, for example, data lines 26; 29, 30, control lines 27 and address lines 28. As an alternative, in each case only some of these different types of lines need to be provided between the two buffer components (as interposed conductor tracks 40) and/or between the respective buffer component and the contact strip (as first and/or second conductor tracks 25a, 25b). The selection and number of the conductor tracks 25a, 40, 25b connected to the buffer components 11, 12 can be constituted such that, for example, between the contact strip and the first buffer component, the respective signals (for instance data values to be stored, control commands and/or address commands) are forwarded exclusively in the direction from the contact strip toward the first buffer component 11, whereas the second conductor tracks 25b exclusively communicate signals (for instance data values to be read out) in the direction from the second buffer component 12 toward the contact strip 3. It may furthermore be provided that the interposed conductor tracks 40 exclusively effect a signal transport from the first buffer component 11 toward the second buffer component 12. A configuration in which all data frames pass from the contact strip via the first conductor tracks 25a, the first buffer component 11, the interposed conductor tracks 40, the second buffer component 12 and the second conductor tracks 25b back again to other contact terminals of the contact strip 3 enables contact terminals to be saved. In particular, contact terminals for output signals of the first buffer component 11 and input terminals for input signals of the second buffer component 12 can be obviated. Instead, output signals AS of the first buffer component 11 can be conducted via the interposed conductor tracks 40, the second buffer component 12 and subsequently via the second conductor tracks 25b to the contact strip 3. Furthermore, input signals ES intended for the second buffer component 12 can be communicated from the contact strip via the first conductor tracks 25a, the first buffer component 11 and the interposed conductor tracks 40 to the second buffer component 12.

By way of example, each of the two buffer components drives half of the memory components 10 fitted on the printed circuit board 2. In this case, the memory components 10 arranged on the second main surface B of the printed circuit board 2 in accordance with FIG. 10 are also driven by the buffer components 11, 12 mounted on the front side. For this purpose, a simplified conductor track course between contact terminals of the second buffer component 12 and the respective memory components 10 arranged on the rear side is illustrated by way of example in the left-hand half of FIG. 10. Detailed courses of the conductor track have been dispensed with for reasons of clarity. The illustration in FIG. 10 is mirrored with respect to the center of the printed circuit board 2 relative to the illustration in FIG. 9, as can be discerned on the basis of the respective directions x and y indicated by arrow directions. The assignment of the semiconductor components 10 to the respective buffer component can be constituted such that, for example, the first buffer component 11 drives the semiconductor components arranged in one half of the printed circuit board (that is to say, for example, on the left in FIG. 9 and on the right in FIG. 10) and the second buffer component 12 drives the rest of the memory components 10. The memory components can once again be arranged in two rows having a respectively different distance from a first edge 21. It goes without saying that any other arrangements and distributions of the memory components on the main surfaces of the printed circuit board 2 are also appropriate. Furthermore, all memory components, as indeed in all the embodiments of this application, can be present in stacked fashion, wherein in each case a bottommost memory component is mounted directly on or at the printed circuit board 2 and in each case carries at least one or else a plurality (for example, three) of further memory components. The arrangement of the two buffer components and the memory components as illustrated in FIGS. 9 and 10 is only by way of example; any other arrangements of the two buffer components within the first main surface A are likewise conceivable.

FIG. 11 shows a further embodiment, in which the semiconductor components of the memory module from FIGS. 9 and 10 are distributed between two separate memory modules. A further memory module 50 to be operated dependently is illustrated at the top in FIG. 11, which module, in a manner similar to the upper memory module from FIGS. 3 and 4, can be operated with the aid of buffer components of another memory module 1, to be precise by means of two buffer components 11, 12 of the lower memory module 1 from FIG. 11. For this purpose, the memory module 1 has a further contact strip 13 arranged at a second edge 22, for example opposite the first edge 21 and hence the first contact strip 3. The further memory module 50 has a contact strip 23, which can be mechanically and electrically connected to the further contact strip 13 of the memory module 1. Connecting lines 45 lead from the buffer components 11, 12 to the further contact strip 13, the connecting lines once again comprising data lines and also control and address lines. They serve for directly driving and operating the memory components 10 of the further memory module 50. Consequently, memory modules 10 need be provided only in a first row R1 on the memory module 1; the further memory module 50 with additional memory components 10 can be connected or inserted into the memory module 1 as necessary. It can likewise be left permanently at the memory module 1.

FIG. 12 shows a further exemplary embodiment of a memory module 60, which has, instead of a second buffer component, a pair of register components 70 connected up to the buffer component 15 of the memory module 60. In the exemplary embodiment in accordance with FIG. 12, the conductor tracks serving for driving the semiconductor components 10 are divided between the buffer component 15 and the respective register component 70. The buffer component 15 is arranged, for example, in the center of the printed circuit board 2 near the contact strip 3 and has first conductor tracks 56, which connect the buffer component 15 to contact terminals 4 of the contact strip 3. Here as well the first conductor tracks 56 comprise data lines 26; 29, 30, control lines 27 and address lines 28, such that all signals intended for the memory components 10 or received from them are conducted via the buffer component 15. Second conductor tracks 57 comprising control lines 27 and address lines 28 are provided between the buffer component 15 and the register components 70. The CA bus (control address) is therefore routed here via a register component proceeding from the buffer component 15. By way of example, at least two register components 70 are provided, such that the memory module can drive a larger number of memory components 10. In this case, the memory components 10 are directly connected to the buffer component 15 via fourth conductor tracks 59, the data lines 26, to be precise first data lines 29 for data to be stored and second data lines 30 for data that are to be read out or are read out. However, the memory components 10 receive the control and address signals via third conductor tracks 58 leading from the register components 70 directly to the respective memory component. The third conductor tracks 59 comprise control lines 27 and address lines 28.

Proceeding from the contact strip, the data signals are thus communicated to the memory components 10 via the first conductor tracks 56, the buffer component 15 and the fourth conductor tracks 59, whereas the control and address signals are communicated to the memory components via the first conductor tracks 56, the buffer component 15, the second conductor tracks 27, the register components 70 and the third conductor tracks 58. Furthermore, at least two register components are provided, wherein a first register component 71 supplies a first group I of semiconductor components or memory components 10 with control and address signals, whereas a second register component 72 supplies a second group II of memory components. By virtue of the fact that a plurality of register components 70; 71, 72 are connected to one buffer component, a larger number of memory components 10 than is conventionally the case can be driven with the aid of a single buffer component 15 because the capacitive load of the control and address lines branching to the respective memory components 10 is carried to the greatest possible extent by the register components 70, 72 and, moreover, is distributed between a plurality of register components 71, 72. Consequently, proceeding from the buffer component 15, the data signals only need be communicated to the respective memory components 10 or be received from them via corresponding data lines 26; 29, 30.

In FIG. 12, only the front side of the memory module 60 is not illustrated. However, no buffer components or register components are present on the rear side, second main surface B. Therefore, the second main surface B can be used to arrange additional memory components 10 there. By way of example, memory components of four memory banks or ranks can be arranged on a single memory module 60 in this way. In this case, each register component 71 or 72 forwards the control and address signals to memory components of in each case two memory banks, that is to say to the respective group I, II of memory components 10.

Figure 13:
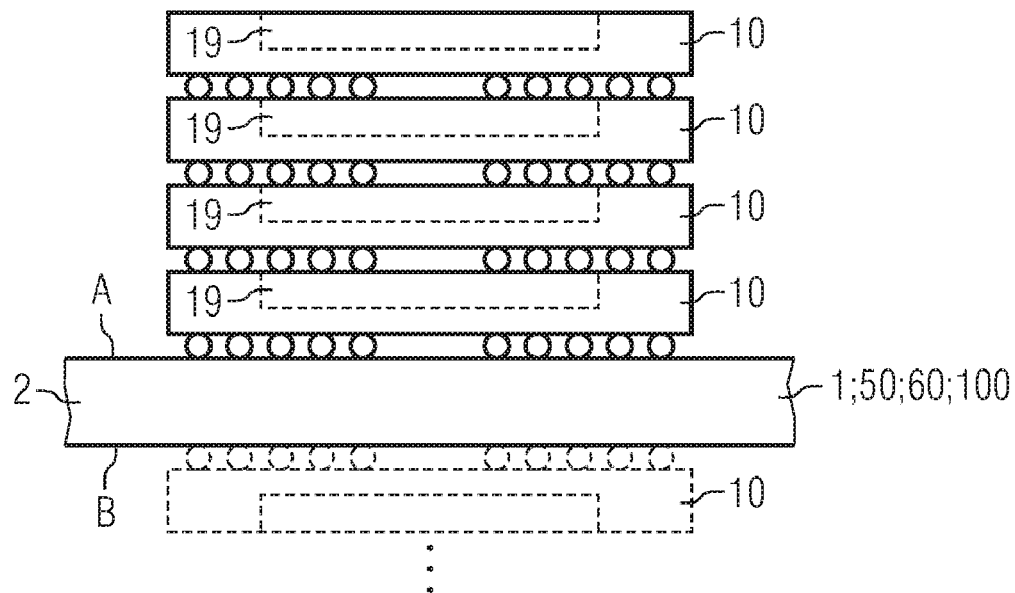
FIG. 13 shows a development of the memory modules with stacked memory components.

FIG. 13 shows a further embodiment of the memory module, only an excerpt from the printed circuit board 2 being illustrated. In accordance with the development, the memory components 10 are arranged in stacks of memory components 10, wherein one respective memory component 10 is mounted directly at the printed circuit board 2 and carries at least one further memory component 10. In accordance with FIG. 3, by way of example, four memory components 10 can be stacked one above another and be arranged on in each case the same area region of the respective main surface A (likewise also on the second main surface B).

Figure 14:
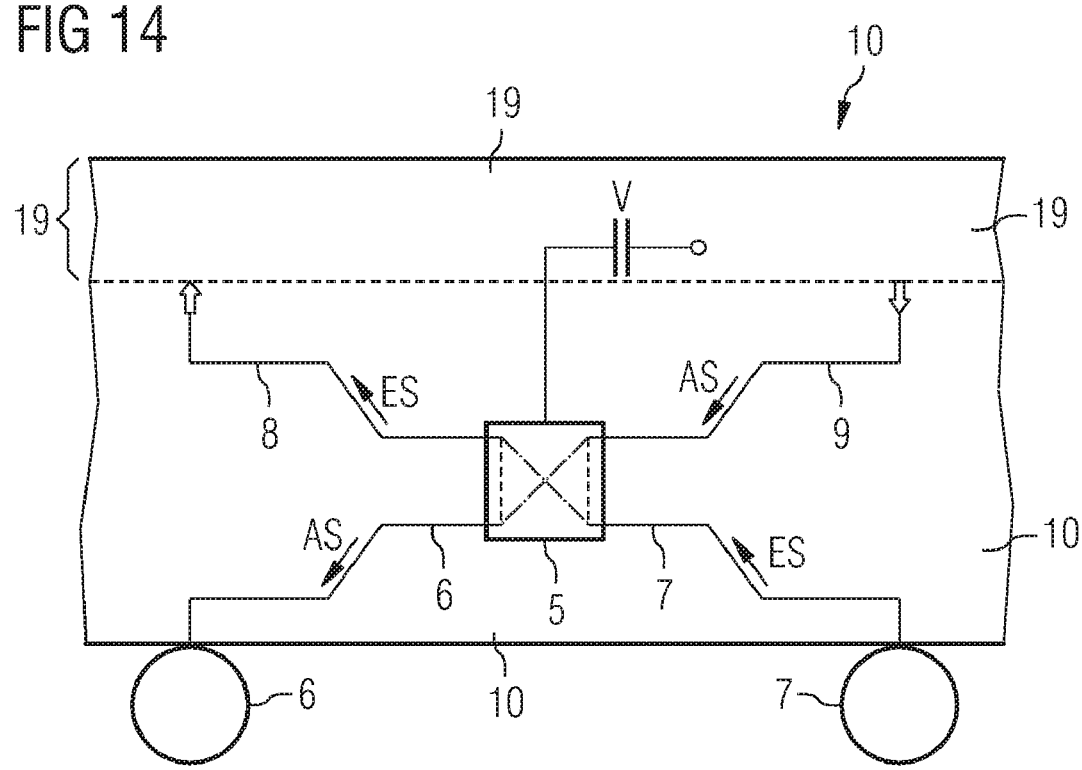
FIG. 14 shows a development of the memory modules with a switching unit for buffer-internal redistribution wiring.

FIG. 14 shows a development with regard to the buffer-internal interconnection of its input and output terminals. This development can be combined with all the embodiments mentioned in the Figures, the patent claims and the description. It is possible in particular in those embodiments in which two buffer components 11, 12 are mounted close together on the printed circuit board. For example when the two buffer components are arranged on opposite main surfaces of the printed circuit board along essentially the same section of the contact strip, it is expedient to use the same or in part the same conductor tracks for connecting both buffer components to the contact strip. Since the buffer components, however, are expediently structurally identical among one another and are arranged on opposite main surfaces, generally the input terminals of one buffer component are arranged in the vicinity of the output terminals of the other buffer component, which makes a more space-saving interconnection more difficult. In accordance with the present development, however, buffer-internally the leads to the external contact terminals of the memory component or of its chip housing can be subjected to redistribution wiring chip-internally, wherein this redistribution wiring or scrambling is performed reversibly and depending on a parameter, for example, an electrical potential or a predeterminable voltage V. For this purpose, in accordance with FIG. 14 a switching device 5 is provided, which is connected up to the input terminals 6 and the output terminals 7 of the memory component 10. Moreover, from the switching device 5 there lead input signal lines 8 and also output signal lines 9 to the memory chip, for example to the volatile random access memory 19 of the memory component 10. The input and output terminals 6, 7 are, for example, external contact terminals of a BGA housing. However, a fixed, no longer changeable interconnection of the input terminals 6 with the input signal lines 8 is provided in a conventional memory component; the same applies to the interconnection of the output signal lines 9 with the output terminals 7. Such an assignment can also be set in the case of the developed memory component presented here; as illustrated within the switching element 5 by the connecting lines which are depicted in dashed fashion and run vertically in FIG. 14. This interconnection can be altered, however; the switching element 5 can alternatively be connected in such a way that instead of the dashed line, the dash-dotted lines (running diagonally in FIG. 14) connect the respective other terminals to the respective signal line. In this way, the input terminals 6 are connected to the output signal lines 9 and the output terminals 7 are connected to the input signal lines 8. The function of the input terminals and of the output terminals is thereby interchanged. Programmed in this way, for example, the second buffer component 12 can be arranged on the rear side, opposite to the first buffer component 11 on the opposite main surface of the printed circuit board and nevertheless be connected (at least partly) to the same contact terminals of the contact strip as the first buffer component 11. Even when both buffer components are arranged alongside one another on the same main surface, to be precise in the same orientation, for example, the interchanging of input and output terminals at one of the buffer components makes it possible to be able to use the same line paths from the contact strip to terminals of both buffer components at least in the center between both buffer components.

The operation of the memory components described here differs from the operation of conventional memory components by virtue of the fact that the signals communicated for the memory components 10 are conducted via in each case one of the two buffer components. Thus, in accordance with FIG. 1, for example, the first buffer component 11 is interposed between the contact strip 3 and the memory components 10 arranged on the first main surface A, whereas on the second main surface B the second buffer component 12 is interposed between the memory components 10 arranged there and the contact strip 3. By way of example, the data signals DQ, in particular, are communicated via the buffer component, for example, with the aid of the data lines 26 or 29 and 30. From the respective buffer component 11, 12 they are communicated via the further conductor tracks 35 to each individual memory component or back from the latter. In further embodiments as well, for example, the one in accordance with FIG. 12, the data values, for instance, are communicated via the buffer component 15 and the fourth conductor tracks 59. It may additionally be provided that the control signals CS and the address signals AS are also conducted via the buffer component, or via one of two buffer components provided. Thus, in FIGS. 1 and 2, the further conductor tracks 35 likewise comprise the control lines 27 and also address lines 28. Corresponding lines are also provided between the contact strip and the respective buffer component 11, 12, 15. The control and address signals can optionally, in addition to the buffer component 15, also be conducted via a respective register component 70 before they reach the respective memory component 10.

It may furthermore be provided that, as illustrated in FIG. 9, input signals for the second buffer component 12 and output signals of the first buffer component 11 are communicated via interposed conductor tracks 40 between the two buffer components 11, 12. The input signal ES and output signal AS can once again comprise data signals DQ, control signals CS and/or address signals AS. Likewise, as illustrated in FIG. 5, all input signals ES and output signals AS of the second buffer component 12 can additionally also be conducted via the first buffer component 11. Finally, it may be provided that such signals are forwarded from one or both buffer components to a further contact strip of the memory module in order to drive operate one or a plurality of memory modules connected downstream via the same buffer component. Further exemplary embodiments emerge upon application of the knowledge and abilities of the person skilled in the art.

What is claimed is:

1. A memory module comprising:
   a printed circuit board with a contact strip;
   a plurality of integrated memory components attached to the printed circuit board;
   a first buffer component attached to the printed circuit board;
   a second buffer component attached to the printed circuit board;
   a plurality of conductor tracks arranged on or in the printed circuit board, the conductor tracks comprising data lines, control lines and address lines, wherein the conductor tracks connect the contact strip to the first buffer component and to the second buffer component; and
further conductor tracks arranged on or in the printed circuit board, the further conductor tracks being interposed only between the first buffer component and the second buffer component to transmit signals between the first buffer component and the second buffer component; and
wherein the first buffer component is configured to only receive signals on the conductor tracks connected to the first buffer component and the second buffer component is configured to only transmit signals on the conductor tracks connected to the second buffer component.

2. The memory module as claimed in claim 1, wherein the first and second buffer components are connected such that output signals of the first buffer component are sequentially communicated to the contact strip via the further conductor tracks, the second buffer component and at least one of the conductor tracks, and such that the second buffer component receives input signals sequentially communicated from the contact strip via at least one of the conductor tracks, via the first buffer component and the further conductor tracks.

3. The memory module as claimed in claim 1, wherein the first and second buffer components are connected such that both input signals intended for the second buffer component and output signals from the second buffer component are conducted via the first buffer component and the further conductor tracks.

4. The memory module as claimed in claim 1, wherein the plurality of conductor tracks comprise first conductor tracks which couple the first buffer component to the contact strip and second conductor tracks which connect the second buffer component to the contact strip.

5. The memory module as claimed in claim 4, wherein the first conductor tracks and the second conductor tracks each comprise data lines, control lines and address lines by which the respective buffer component is coupled to the contact strip.

6. The memory module as claimed in claim 1, wherein the first and second buffer components are both arranged on a main surface of the printed circuit board along two different sections of the contact strip.

7. The memory module as claimed in claim 1, wherein the first buffer component and the second buffer component are both arranged on a main surface of the printed circuit board along the same section of the contact strip and are at distances of different magnitudes from the contact strip.

8. A memory module comprising:
a printed circuit board;
a first contact strip arranged along a first edge of the printed circuit board;
a second contact strip arranged along a second edge of the printed circuit board;
a plurality of integrated memory components attached to the printed circuit board;
a first buffer component attached to the printed circuit board;
a second buffer component attached to the printed circuit board;
a plurality of conductor tracks arranged on or in the printed circuit board, the conductor tracks comprising data lines, control lines and address lines, wherein the conductor tracks connect the first contact strip to the first buffer component and to the second buffer component; and
connecting lines that connect the first buffer component and the second buffer component to the second contact strip, wherein the second contact strip is configured to couple to a further memory module having a plurality of integrated memory components and without buffer and/or register components.

9. The memory module as claimed in claim 8, wherein the connecting lines comprise data lines, control lines and address lines.

10. A memory module comprising:
a printed circuit board with at least one contact strip;
a plurality of integrated memory components attached to the printed circuit board;
a first buffer component attached to the printed circuit board;
a second buffer component attached to the printed circuit board, wherein the second buffer component comprises a switching device for altering an assignment of external contact terminals of the second buffer component;
a plurality of conductor tracks arranged on or in the printed circuit board, the conductor tracks comprising data lines, control lines and address lines, wherein the conductor tracks connect the at least one contact strip and at least one of the first buffer component and the second buffer component; and
wherein, the switching device is configured to switch from, based on a preset parameter and an applied voltage, a first configuration where input terminals of the second buffer component are connected to buffer-internal input signal lines and output terminals of the second buffer component are connected to buffer-internal output signal lines to a second configuration where the buffer-internal output signal lines are connected to the input terminals and the buffer-internal input signal lines are connected to the output terminals.

11. The memory module as claimed in claim 10, wherein the first buffer component and the second buffer component are arranged on opposite main surfaces of the printed circuit board.

12. The memory module as claimed in claim 10, wherein the first buffer component and the second buffer component are arranged along the same section of the contact strip.

13. The memory module as claimed in claim 10, wherein the at least one contact strip comprises a plurality of contact terminals on two main surfaces of the printed circuit board.

14. A memory module comprising:
a printed circuit board with at least one contact strip;
a plurality of memory components attached to the printed circuit board;
a buffer component attached to the printed circuit board;
first conductor tracks connecting the buffer component to the at least one contact strip, the first conductor tracks including data lines, address lines and command lines;
two register components;
second conductor tracks connecting a respective one of the two register components to the buffer component, the second conductor tracks including address lines and command lines;
third conductor tracks connecting the memory components to a respective one of the two register components, the third conductor tracks including address lines and command lines; and
fourth conductor tracks connecting the memory components to the buffer component, the fourth conductor tracks including data lines.

* * * * *